US012665595B2

(12) United States Patent
Werner et al.

(10) Patent No.: US 12,665,595 B2
(45) Date of Patent: Jun. 23, 2026

(54) AC SWITCH WITH SUPPLY REGULATION

(71) Applicant: POWER INTEGRATIONS, INC., San Jose, CA (US)

(72) Inventors: Antonius Jacobus Johannes Werner, Chesterton (GB); David Michael Hugh Matthews, Los Gatos, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

(21) Appl. No.: 18/845,348

(22) PCT Filed: May 26, 2022

(86) PCT No.: PCT/US2022/030995
§ 371 (c)(1),
(2) Date: Sep. 9, 2024

(87) PCT Pub. No.: WO2023/229595
PCT Pub. Date: Nov. 30, 2023

(65) Prior Publication Data
US 2025/0192772 A1      Jun. 12, 2025

(51) Int. Cl.
*H03K 17/687* (2006.01)
*H02M 1/08* (2006.01)
(52) U.S. Cl.
CPC ........ *H03K 17/6871* (2013.01); *H02M 1/083* (2013.01)
(58) Field of Classification Search
CPC ...... H03K 17/51; H03K 17/56; H03K 17/687; H03K 17/6871; H03K 2217/0081;
(Continued)

(56) References Cited

U.S. PATENT DOCUMENTS 8,664,889 B2    3/2014  Newman, Jr. et al.
9,331,587 B2    5/2016  Djenguerian et al.
(Continued)

OTHER PUBLICATIONS

International Search Report and Written Opinion mailed Jan. 20, 2023, issued in corresponding International Patent Application No. PCT/US2022/030995, 10 pages.
(Continued)

Primary Examiner — Long Nguyen
(74) Attorney, Agent, or Firm — Christensen O'Connor Johnson Kindness PLLC

(57) ABSTRACT

An ac switch configured to couple and decouple an ac input to a load, the ac switch comprising a first transistor, a second transistor, and a switch controller configured to control the turn ON and turn OFF of the first transistor and the second transistor in response to a request signal. The ac switch comprises an off-state regulator to provide supply regulation to the switch controller in response to the request signal indicating to decouple the ac input to the load and an on-state regulator to provide supply regulation to the switch controller in response to the request signal indicating to couple the ac input to the load. The off-state regulator is configured to provide supply regulation for the switch controller at an extremum of the ac input and the on-state regulator is configured to provide supply regulation for the switch controller at a zero-crossing of the ac input.

24 Claims, 5 Drawing Sheets

(58) Field of Classification Search
CPC .... H02M 1/0003; H02M 1/0006; H02M 1/08;
H02M 1/081; H02M 1/082; H02M 1/083;
H02M 1/088; H02M 1/096; H02M 3/00;
H02M 3/02; H02M 3/22; H02M 7/2176
See application file for complete search history.

(56) References Cited

U.S. PATENT DOCUMENTS

| | | | |
|---|---|---|---|
| 9,418,809 B2 | 8/2016 | Hausman, Jr. et al. | |
| 9,479,065 B2 | 10/2016 | Mao et al. | |
| 10,326,306 B2 | 6/2019 | Peter et al. | |
| 11,258,369 B2 | 2/2022 | Odell | |
| 11,349,296 B2 * | 5/2022 | Telefus | H02H 3/105 |
| 11,418,121 B2 | 8/2022 | Odell et al. | |
| 11,932,123 B2 | 3/2024 | Dustert et al. | |
| 11,979,090 B2 | 5/2024 | Werner et al. | |
| 12,413,167 B2 | 9/2025 | Matthews et al. | |
| 2016/0111961 A1 * | 4/2016 | Balakrishnan .... | H02M 3/33507 |
| | | | 363/21.12 |
| 2020/0365346 A1 * | 11/2020 | Telefus | H02M 1/083 |

OTHER PUBLICATIONS

Power Integrations Applications Engineering Department; "Design Example Report" for Specification 90 VAC-277 Vac Input; Application: Lighting Control; Document No. DER-622; dated Aug. 8, 2017; 40 pages total.

Power Integrations Applications Engineering Department; "Design Example Report" for Specification 90 VAC-277 VAC; Application: Lighting Control, Home Automation; Document No. DER-867; dated Oct. 13, 2022; 77 pages total.

Power Integrations Applications Engineering Department; "Design Example Report" for Specification 90 VAC-277 VAC Input; Application: Lighting Control, Home Automation; Document No. DER-832; dated Sep. 18, 2019; 38 pages total.

Power Integrations Applications Engineering Department; "Design Example Report" for Two-Wire (No Neutral), Wide-Range, Isolated Flyback, Bluetooth Wall Switch Using Power Integrations LinkSwitchTM-TN2 LNK3202D and Nordic BLE/MCU nRF52382; 90 VAC-277 VAC Input; Application: Lighting Control, Home Automation; Document No. DER-832; dated Sep. 18, 2019; 38 pages total.

Power Integrations Applications Engineering Department; "Design Example Report" for Two-Wire (No Neutral), Wide-Range, Isolated Flyback, Bluetooth Wall Switch Using Power Integrations LinkSwitchTM-TN2 LNK3202D; 90 VAC-277 VAC Input; Application: Lighting Control, Home Automation; Document No. DER-867; dated Oct. 13, 2022; 77 pages total.

Power Integrations Applications Engineering Department; "Design Example Report" for Two-Wire (No Neutral), Wide-Range, Isolated Flyback, Bluetooth Wall Switch Using LinkSwitchTM-TN2 LNK3202D; 90 VAC-277 VAC Input; Application: Lighting Control; Document No. DER-622; dated May 2, 2018; 40 pages total.

* cited by examiner

OFF-STATE REGULATOR ENABLED

OFF-STATE REGULATOR ENABLED
C1 = LARGE

301

T₁, T₃ :: DIODE D1 is
CONDUCTING
T2, T4 :: DIODE D2 is
CONDUCTING
D1 and D2 stop conducting
at extremums of VAC

AC SWITCH WITH SUPPLY REGULATION

CROSS-REFERENCES TO RELATED APPLICATIONS

This application is a National Stage of International Application No. PCT/US2022/030995 filed May 26, 2022.

BACKGROUND OF THE INVENTION

Field of the Invention

The present invention relates generally to ac switches, and more specifically, to smart ac switches.

Discussion of the Related Art

A ac switch may be used to couple or decouple an input to a load. In other words, the ac switch "interrupts" or "breaks" (e.g. opens) the circuit and can also "complete" (e.g. closes) the circuit. The ac switch may be ON (e.g. closed) and may conduct current between the input and the load. When the ac switch is OFF (e.g. open), the load generally receives negligible current from the input. AC switches may utilize mechanical, electrical, or a combination of mechanical and electrical components to break or complete the circuit. For a mechanical ac switch, mechanical components such as buttons, toggles etc. are utilized to physically interrupt or complete the circuit. For an electrical ac switch, electrical components such as electrical switches (e.g. transistors) and relays are utilized to electrically interrupt or complete the circuit.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
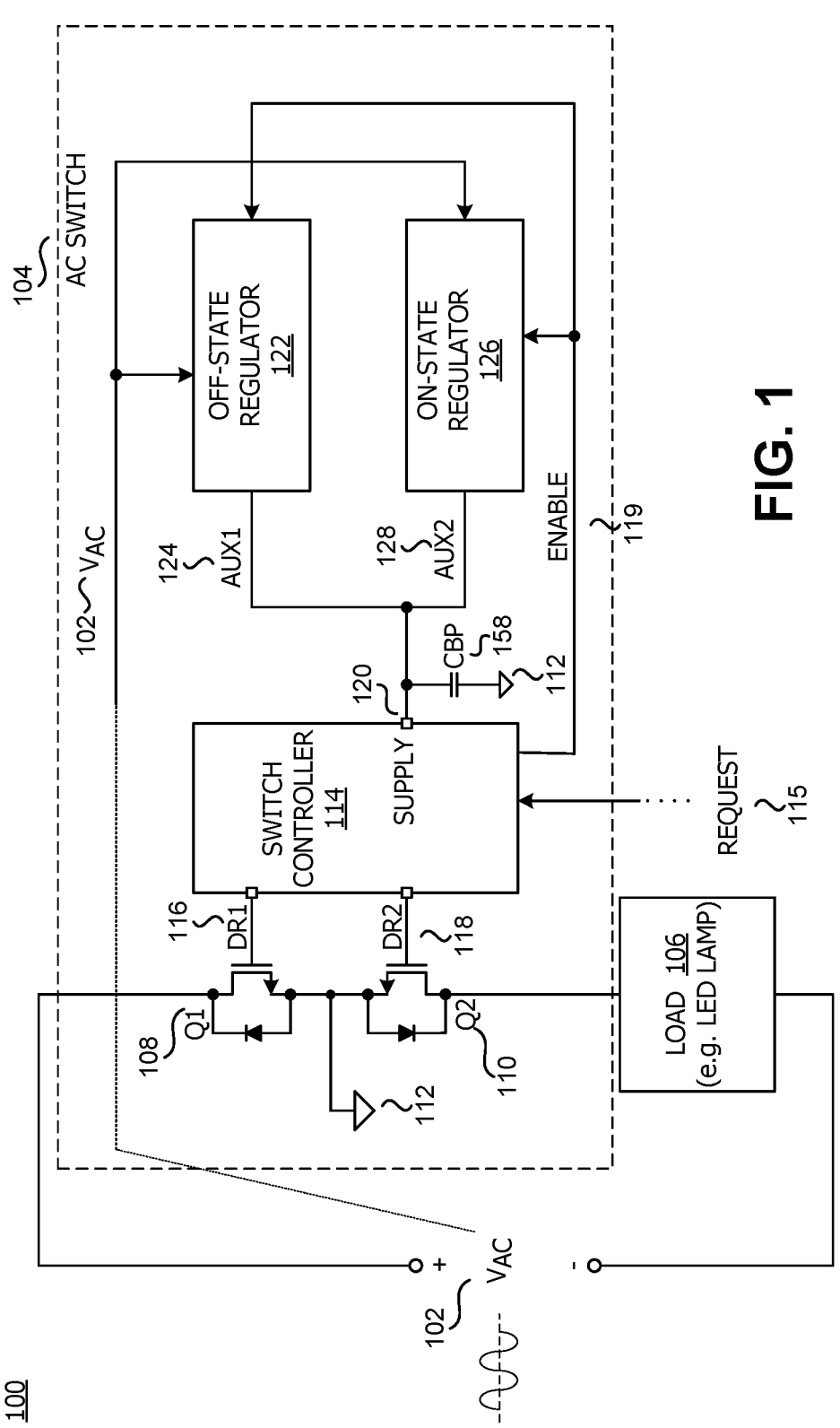
FIG. 1 is a system with an ac switch including an off-state regulator and an on-state regulator, in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

AC switches may utilize mechanical, electrical, or a combination of mechanical and electrical components. Electrical switches, such as transistors, relays, triodes, thyristor, etc, may be utilized in ac switches. However, to turn ON and turn OFF an electrical switch, a driver or controller is utilized to provide the voltages and/or currents for the electrical switch to operate and the driver and/or controllers themselves require power to operate.

One example ac switch may be utilized for lighting, also commonly referred to as a "wall switch," which couples or decouples a lamp, such as an incandescent or a (LED) lamp, to a high voltage alternating current (ac) input. The ac switch utilizes a mechanical toggle along with an electrical switch to break or complete the coupling between the high voltage ac input and the lamp. A single pole ac switch, sometimes also referred to as a single pole switch or a two-terminal switch, may be utilized for lighting applications. For a single pole ac switch, the ac switch has two connections, one to the high voltage ac input and one to the lamp (e.g. the load). The single-pole ac switch is either "ON" (e.g. closed) or "OFF" (e.g. open) and control of the single pole ac switch interrupts the ac input current to the lamp.

AC switches may be designed to be "smart" ac switches, in which the controller which controls the turn ON and turn OFF of the electrical switch may respond to multiple user input signals in addition to the mechanical toggle. These user input signals may include communication signals from a mobile phone or home automation device. For example, "smart" ac switches for lighting may include features to turn ON and OFF a lamp from a signal received through a WiFI network or Bluetooth connection from a mobile phone, or a voice activated home automaton device, or automatically be set to a safety mode under user programmed conditions. These "smart" features generally require active electronics, such as a microcontroller, Bluetooth circuitry, wireless communications, etc., for the controller of the ac switch. As such, the controller for the ac switch may require significant operational power (e.g. supply) to operate.

However, providing supply for the controller of an ac switch when the ac switch is controlled ON or OFF may be difficult, in particular for single pole ac switches. When the ac switch is controlled ON to couple to the ac input to the load, there is usually negligible voltage across the electrical switch or switches of the ac switch. When the ac switch is controlled OFF to decouple the ac input to the load, the amount of current drawn from the ac input voltage should be controlled; otherwise the load may exhibit an undesirable response to the current it receives. For example, if the load is an electronic circuit, a relatively low current drawn continuously from the ac input voltage may intermittently activate the load.

Embodiments of the present disclosure include an ac switch with supply regulation. The ac switch couples or decouples an ac input to a load. In one embodiment the ac switch includes a switch controller which controls the ac switch. In embodiments, the ac switch includes an off-state regulator which provides supply regulation for the switch controller when the ac switch receives a request to decouple the ac input from the load. Further, the off-state regulator provides operating power to the switch controller during an extremum of an ac input, such as an ac input voltage. As used herein "extremum" or "extrema" includes any local maximum or minimum points or may be referred to as "peaks" and "valleys" of a signal, where mathematically, the slope (i.e., derivative of the ringing/oscillation waveform) approaches zero. In one embodiment, the off-state regulator includes a step down converter which converts the high voltage ac input to a low voltage supply for the switch controller.

In embodiments, the ac switch also includes an on-state regulator to provide supply regulation to the switch controller in response to a request to couple the ac input to the load. Further, the on-state regulator is configured to provide supply regulation for the switch controller substantially near a zero-crossing of the ac input. The zero-crossing generally refers to when the ac input, such as an ac input voltage, crosses zero voltage. In other words, the zero-crossing refers to when the ac input voltage changes sign from positive to negative or from negative to positive. Further, while the on-state regulator provides supply regulation for the switch controller, the switch controller controls at least one electrical switch of the ac switch OFF. The on-state regulator includes electrical switches and controls the electrical switches ON to redirect current to the supply of the switch controller.

FIG. 1 illustrates circuit 100 including a ac switch 104 and load 106. The ac switch 104 and the load 106 are coupled to receive the ac input voltage $V_{AC}$ 102. The ac switch 104 is configured to couple and decouple the ac input voltage $V_{AC}$ 102 to and from the load 106. When the ac switch 104 couples the ac input voltage $V_{AC}$ 102 to the load 106, current may flow from the input to the load 106. When the ac switch 104 decouples the ac input voltage $V_{AC}$ 102 from the load 106, current should not flow from the input to the load 106.

The ac switch 104 is shown as including electrical switch Q1 108 and electrical switch Q2 110, which are exemplified as transistors with an anti-parallel diode. In the example shown, the transistors are n-type metal-oxide field-effect transistors (MOSFETs), however it should be appreciated that other transistors may be utilized. For example, transistors such as a bipolar junction transistor (BJT), an insulated-gate bipolar transistor (IGBT), a gallium nitride (GaN) based transistor or a silicon carbide (SiC) based transistor may be utilized as electrical switches. Further, electrical switches may also include relays, triodes, thyristors or other electrical components which may control current flow.

As shown, the drain of electrical switch Q1 108 is coupled to positive terminal of input voltage $V_{AC}$ 102 while the source of electrical switch Q1 108 is coupled to the source of electrical switch Q2 110. The drain of electrical switch Q2 110 is coupled to the load 106. The mid-point between the electrical switch Q1 108 and electrical switch Q2 110 is coupled to return 112. In other words, the source of both electrical switches Q1 108, Q2 110 are coupled to return 112. The transistors which comprise electrical switches Q1 108, Q2 110 couple together as a bidirectional electrical switch. The turn ON and turn OFF of electrical switch Q1 108 and electrical switch Q2 110 electrically couple and decouple the ac input voltage $V_{AC}$ 102 to load 106.

AC switch 104 is also shown as including switch controller 114, off-state regulator 122 and on-state regulator 126. In one example, ac switch 104 is configured to receive a request signal 115 representative of a request for the ac switch 104 to couple or decouple the ac input voltage $V_{AC}$ 102 to the load 106. The request signal 115 may be a voltage signal, current signal, or both. Further, the request signal 115 may be a rectangular pulse waveform with varying durations of "high" and "low" sections. A "high" section may represent a request to couple the ac input voltage $V_{AC}$ 102 to the load 106 (e.g. turn "ON" the ac switch) while a "low" value may represent a request to decouple the ac input voltage $V_{AC}$ 102 from the load 106 (e.g. turn "OFF" the ac switch), or vice versa. It should be appreciated that other examples to convey information through a signal could be used. The request signal 115 may be generated by a user to control the turn ON and turn OFF of the ac switch. For example, the request signal 115 may be generated from a mechanical switch which is physically manipulated by a user to turn ON or OFF the ac switch, received through a WiFI network from a mobile phone or tablet, received through a Bluetooth connection with a mobile phone or tablet, or received from a voice activated home automaton device, etc.

Switch controller 114 is illustrated as receiving the request signal 115 and outputting the drive signal DR1 116, and drive signal DR2 118 in response to the request signal 115. Switch controller 114 controls the turn ON and turn OFF of electrical switches Q1 108 and Q2 110 in response to the request signal 115. Switch controller 114 outputs drive signal DR1 116 to control the turn ON and turn OFF of electrical switch Q1 108 and outputs drive signal DR2 118 to control the turn ON and turn OFF of electrical switch Q1 108. Drive signals DR1 116, DR2 118 may be rectangular pulse waveforms with varying durations of "high" and "low" sections. A "high" section may correspond to an ON electrical switch while a low section may correspond to an OFF electrical switch.

In operation, if the request signal 115 indicates to couple the ac input voltage $V_{AC}$ 102 to the load 106, switch controller 114 outputs drive signal DR1 116 and drive signal DR2 118 to turn ON (e.g. conduct) electrical switch S1 108 and electrical switch S2 110, respectively. When electrical switches S1 108, S2 110 are ON, current conducts through the transistor of electrical switch Q1 and through the transistor of electrical switch Q2 110. If the request signal 115 indicates to decouple the ac input voltage $V_{AC}$ 102 from the load 106, switch controller 114 outputs drive signal DR1 116 and drive signal DR2 118 to turn OFF electrical switch S1 108 and electrical switch S2 110, respectively. When electrical switches S1 108, S2 110 are OFF, the anti-parallel diode of electrical switch Q1 108 acts as a blocking diode for positive values of the ac input voltage $V_{AC}$ 102 and the anti-parallel diode of electrical switch Q2 110 acts as a blocking diode for negative values of the ac input voltage $V_{AC}$ 102.

Switch controller 114 also includes a supply terminal 120 and a capacitance CBP 158 is coupled to the supply terminal 120 and return 112. The supply terminal 120 receives operating voltage, operating current, and/or operating power to supply the circuits of the switch controller 114. As will be discussed, the voltage ($V_{SUPPLY}$) across the capacitance CBP 158 may be regulated to a sufficient value to operate the circuits of the switch controller 114. In one example, the voltage ($V_{SUPPLY}$) across the capacitance CBP 158 may be regulated to a regulation value ($V_{REG}$) to supply switch controller 114.

Switch controller 114 is further illustrated as receiving the request signal 115 and outputting enable signal 119 in response to the request signal 115. AC switch 104 further includes the off-state regulator 122 and the on-state regulator 126. The enable signal 119 is received by the off-state regulator 122 and on-state regulator 126. In one example, the enable signal 119 is a rectangular pulse waveform with varying durations of "high" and "low" sections. In one example, a "high" section may represent a command to enable the on-state regulator 126 while a "low" section may represent a command to enable the off-state regulator 122, or vice versa. In another example, a leading edge in the enable signal 119 may represent a command to enable the on-state regulator 126 while a trailing edge may represent a command to enable the off-state regulator 122, or vice versa. It should be appreciated that other examples to convey information through a signal could be used. In operation, if the request signal 115 indicates to couple the ac input voltage $V_{AC}$ 102 to the load 106, the switch controller 114 outputs the enable signal 119 to enable the on-state regulator 126 and disable the off-state regulator 122. If the request signal 115 indicates to decouple the ac input voltage $V_{AC}$ 102 from the load 106, the switch controller 114 outputs the enable signal 119 to disable the on-state regulator 126 and enable the off-state regulator 122.

The off-state regulator 122 is configured to receive the ac input voltage $V_{AC}$ 102 and outputs a regulation signal AUX1 124. The regulation signal AUX1 124 may be a voltage or current signal. The off-state regulator 122 provides supply regulation for the switch controller 114 when the ac switch 104 receives a request to decouple the ac input voltage $V_{AC}$ 102 from the load 106. Further, the off-state regulator 122 regulates the voltage ($V_{SUPPLY}$) across the capacitance CBP 158 to provide an operating voltage, operating current, and/or operating power to the switch controller 114. In operation, the off-state regulator provides supply regulation for the switch controller 114 during extrema of the ac input voltage $V_{AC}$ 102. As used herein, "extremum" or "extrema" includes any local maximum or minimum points, which may also be referred to as "peaks" and "valleys," of a signal where mathematically the slope (i.e., derivative of the ringing/oscillation waveform) approaches zero. The off-state regulator 122 outputs a regulation signal AUX1 124 to regulate the voltage ($V_{SUPPLY}$) across the capacitance CBP 158. As will be further discussed, the off-state regulator 122 includes a step down converter which provides a low voltage supply from the ac input voltage $V_{AC}$ 102. In one embodiment, the step down converter provides the regulation signal AUX1 124 to regulate the voltage ($V_{SUPPLY}$) across the capacitance CBP 158.

The on-state regulator 126 is configured to receive the ac input voltage $V_{AC}$ 102 and outputs a regulation signal AUX2 128. The regulation signal AUX2 128 may be a voltage or current signal. The on-state regulator 126 provides supply regulation for the switch controller 114 when the ac switch 104 receives a request to couple the ac input voltage $V_{AC}$ 102 to the load 106. Further, the on-state regulator 126 regulates the voltage ($V_{SUPPLY}$) across the capacitance CBP 158 to provide an operating voltage, operating current, and/or operating power to the switch controller 114. In operation, the on-state regulator 126 is configured to provide supply regulation for the switch controller 114 substantially near a zero-crossing of the ac voltage $V_{AC}$ 102. The zero-crossing generally refers to when the ac input voltage $V_{AC}$ 102 crosses zero voltage. In other words, the zero-crossing refers to when the ac input voltage $V_{AC}$ 102 changes sign from positive to negative or from negative to positive. The on-state regulator 126 provides the regulation signal AUX2 128 to regulate the voltage ($V_{SUPPLY}$) across the capacitance CBP 158. In one embodiment, the on-state regulator 126 is configured to provide supply regulation for the switch controller 114 just prior to a zero-crossing of the ac input voltage $V_{AC}$ 102 and until the voltage ($V_{SUPPLY}$) across the capacitance CBP 158 reaches a regulation a regulation value ($V_{REG}$). In other words, the regulation signal AUX2 128 is provided just prior to a zero-crossing of the ac input voltage $V_{AC}$ 102 and until the voltage ($V_{SUPPLY}$) across the capacitance CBP 158 reaches a regulation value ($V_{REG}$). While the on-state regulator 126 outputs the regulation signal AUX2 to provide supply regulation and operational power for the switch controller 114, the switch controller 114 controls the electrical switches Q1 108, Q2 110 OFF.

Further, in one embodiment the on-state regulator 126 includes electrical switches and current sources. When the on-state regulator 126 outputs the regulation signal AUX2 to provide supply regulation for the switch controller 114, the on-state regulator 126 turns ON at least one of the electrical switches to redirect current from the ac input voltage $V_{AC}$ 102 to the supply terminal 120 and to capacitance CBP 158. The redirected current is utilized to charge the capacitance CBP 158 and regulate the voltage ($V_{SUPPLY}$) across the capacitance CBP 158. The amount of current which is redirected is controlled by the current sources of the on-state regulator 126. As such, the ac switch 104 includes supply regulation for the switch controller 114 when the ac switch 104 is controlled to couple or decouple the ac input voltage $V_{AC}$ 102 and load 106.

Figure 2A:
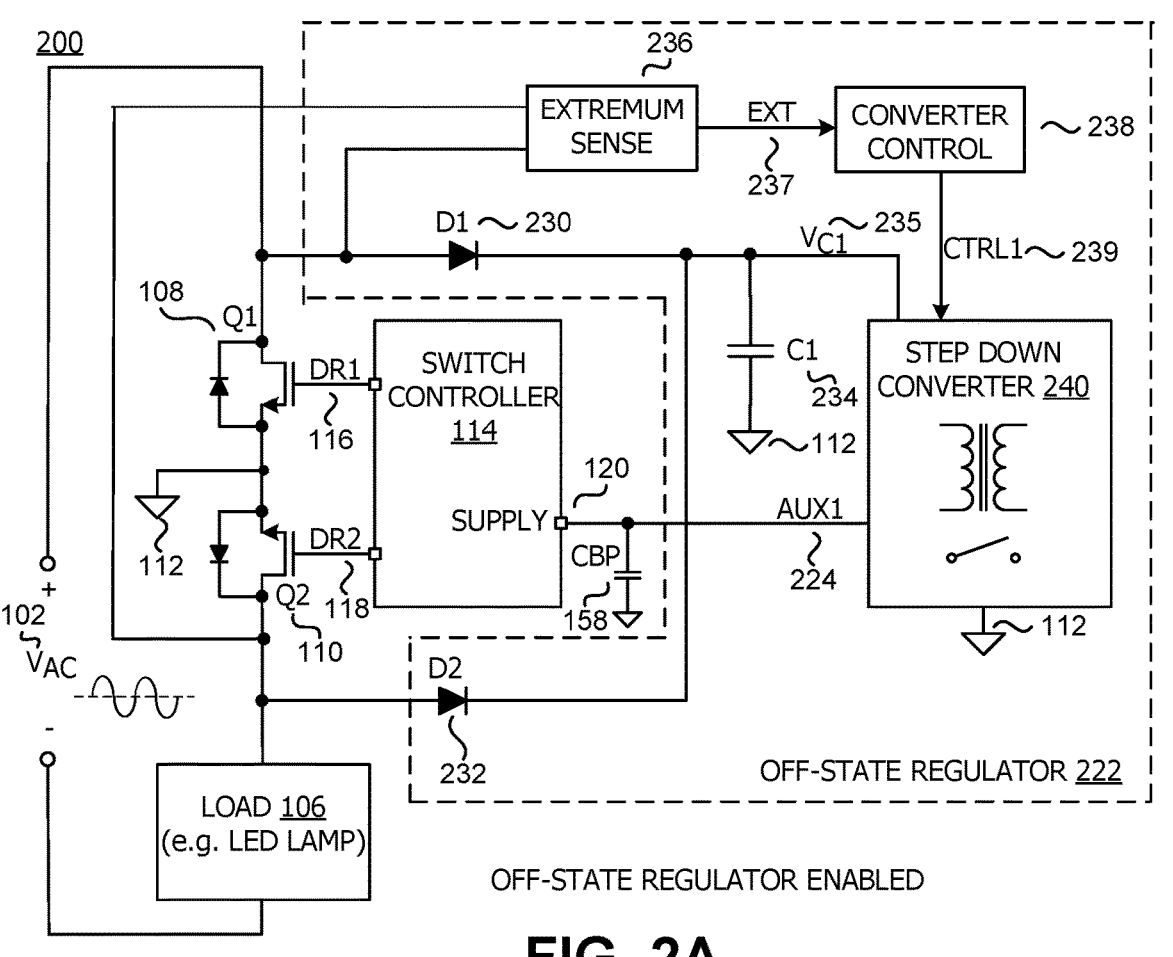
FIG. 2A is one example of the off-state regulator of FIG. 1, in accordance with embodiments of the present disclosure.

FIG. 2A illustrates an off-state regulator 222 which outputs a regulation signal AUX1 224, which is one example of the off-state regulator 122 and regulation signal AUX 1 124 shown with respect to FIG. 1. It should be appreciated that similarly named and numbered elements couple and function as described above. Further, the on-state regulator, request signal and enable signal are not shown for clarity. For the circuit 200 shown, the request signal indicates to decouple the ac input voltage $V_{AC}$ 102 from the load 106 and the enable signal enables the off-state regulator 222 to provide supply regulation and disables the on-state regulator.

Off-state regulator 222 is shown including diodes D1 230, D2 232, capacitance C1 234, extremum sense 236, converter control 238, and step down converter 240. Further shown in FIG. 2 are the capacitance voltage $V_{C1}$ 235, extremum signal EXT 237, a control signal CTRL1 239, and Diode D1 230 is coupled to the positive terminal of the ac input voltage $V_{AC}$ 102 while diode D2 232 is coupled to load 106. Capacitance C1 234 is coupled to diode D1 230 and diode D2 232 and referenced to return 112. In particular, the capacitance C1 234 is coupled to the cathode of both diodes D1 230, D2 232. The anode of diode D1 230 is coupled to the ac input voltage $V_{AC}$ 102 while the anode of diode D1 230 is coupled to the load 106.

In operation, diodes D1 230, D2 232 provide rectification and a path to charge capacitance C1 234 from the ac input voltage $V_{AC}$ 102. However, it should be appreciated that the diode D2 232 may be optional. In one example, capacitance C1 234 (e.g. $V_{C1}$ 235) may substantially follow the rectified ac input voltage $V_{AC}$ 102.

Extremum sense 236 is configured to receive the ac input voltage $V_{AC}$ 102 and outputs the extremum signal EXT 236. In operation, the extremum sense 236 receives the ac input voltage $V_{AC}$ 102 and senses when extremums (e.g. "peaks" or "valleys") occur of the ac input voltage $V_{AC}$ 102. The extremum sense 236 may utilize peak detection circuits to sense the extremums of the ac input voltage $V_{AC}$ 102. Extremum sense 236 outputs the extremum signal EXT 236, which is representative of sensed extremums of the ac input voltage $V_{AC}$ 102. The extremum signal EXT 236 may be rectangular pulse waveform with varying durations of "high" and "low" sections. In one example, the extremum signal EXT 236 may be "high" to indicate that an extremum is sensed in the ac input voltage $V_{AC}$ 102, or vice versa.

Converter control 238 is configured to receive the extremum signal EXT 236 and outputs a control signal CTRL1 239 and enables to operation of the step down converter 240. The converter control 238 utilizes the extremum signal EXT 236 to synchronize the control signal CTRL1 239 to enable the operation of step down converter 240 with the sensed extremums in the ac input voltage $V_{AC}$ 102.

Step down converter 240 is shown as receiving the capacitance voltage $V_{C1}$ 235 at its input and outputs the regulation signal AUX1 224. Step down converter 240 also receives the control signal CTRL1 239, which enables and controls the operation of the step down converter 240. In embodiments, step down converter may be an isolated or non-isolated switching step down power converter, such as a step down converter in a buck or flyback configuration. However, it should be appreciated that other step down converter topologies could be utilized. Further, the step down converter may be a step down linear power converter.

In response to the control signal CTRL1 239, the step down converter 240 outputs the regulation signal AUX1 224 to provide operational supply to the switch controller 114 from the capacitance voltage $V_{C1}$ 235. In operation, the step down converter 240 "steps down" (e.g. reduces) the received capacitance voltage $V_{C1}$ 235 and outputs the regulation signal AUX1 224 which is used to regulate the voltage ($V_{SUPPLY}$) across capacitance $C_{BP}$ 158. Further, the step down converter 240 provides the regulation signal AUX1 224 to the switch controller 114 during the sensed extremums of the ac input voltage $V_{AC}$ 102.

When the ac switch 104 is controlled to decouple the ac input from the load 106, the amount of current drawn from the ac input voltage $V_{AC}$ 102 should be controlled; otherwise the load 106 may exhibit an undesirable response to the current it receives. For example, if the load 106 is an electronic circuit such as an LED lamp, a relatively low current drawn continuously from the ac input voltage $V_{AC}$ 102 may intermittently activate the load 106. Further, the average current is lowest at the extremums of the ac input voltage $V_{AC}$ 102. As such, the off-state regulator 222 does not continuously draw current from the ac input voltage $V_{AC}$ 102. Rather, the off-state regulator 222 draws current during extremums of the ac input voltage $V_{AC}$ 102 to regulate the supply to switch controller 114.

Figure 2B:
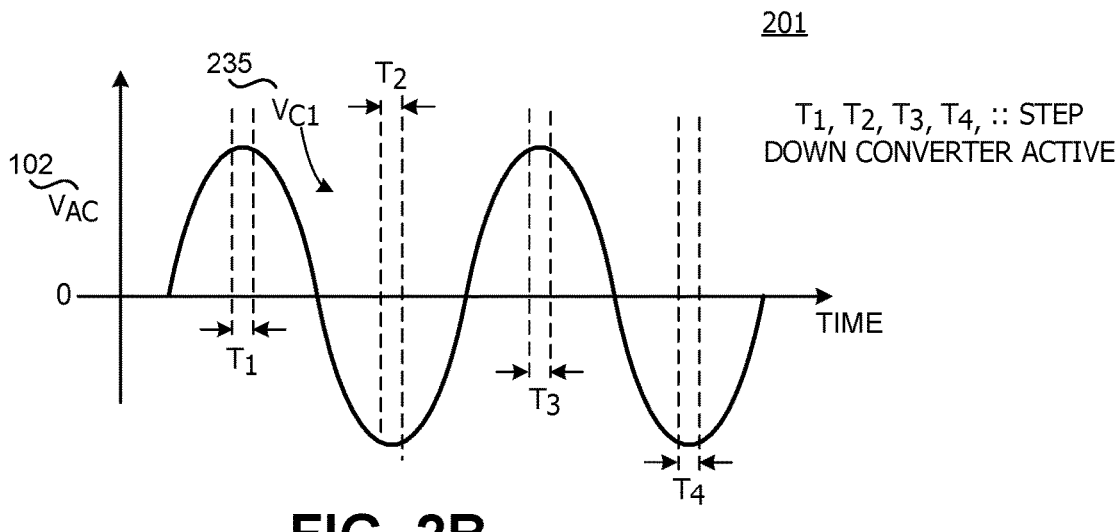
FIG. 2B is a timing diagram for various waveforms of the system and off-state regulator of FIG. 2A, in accordance with embodiments of the present disclosure.

FIG. 2B illustrates timing diagram 201 for the ac input voltage $V_{AC}$ 102 and the capacitance voltage $V_{C1}$ 235 for the circuit 200 shown in FIG. 2A. The vertical dashed lines shown in FIG. 2B indicate durations T1, T2, T3 and T4. Durations T1, T2, T3 and T4 are the durations of time which the step down converter 240 is active. In other words, durations T1, T2, T3 and T4 represent the durations of time when the step down converter 240 is controlled to provide supply from the ac input voltage $V_{AC}$ 102 via the capacitance voltage $V_{C1}$ 234 to the switch controller 114. During durations T1, T2, T3 and T4, the converter control 238 outputs the control signal CTRL1 239 to activate step down converter 240. Said differently, durations T1, T2, T3 and T4 represent the durations of time when the off-state regulator 222 is providing supply to switch controller 114 from the ac input voltage $V_{AC}$ 102.

Figure 3A:
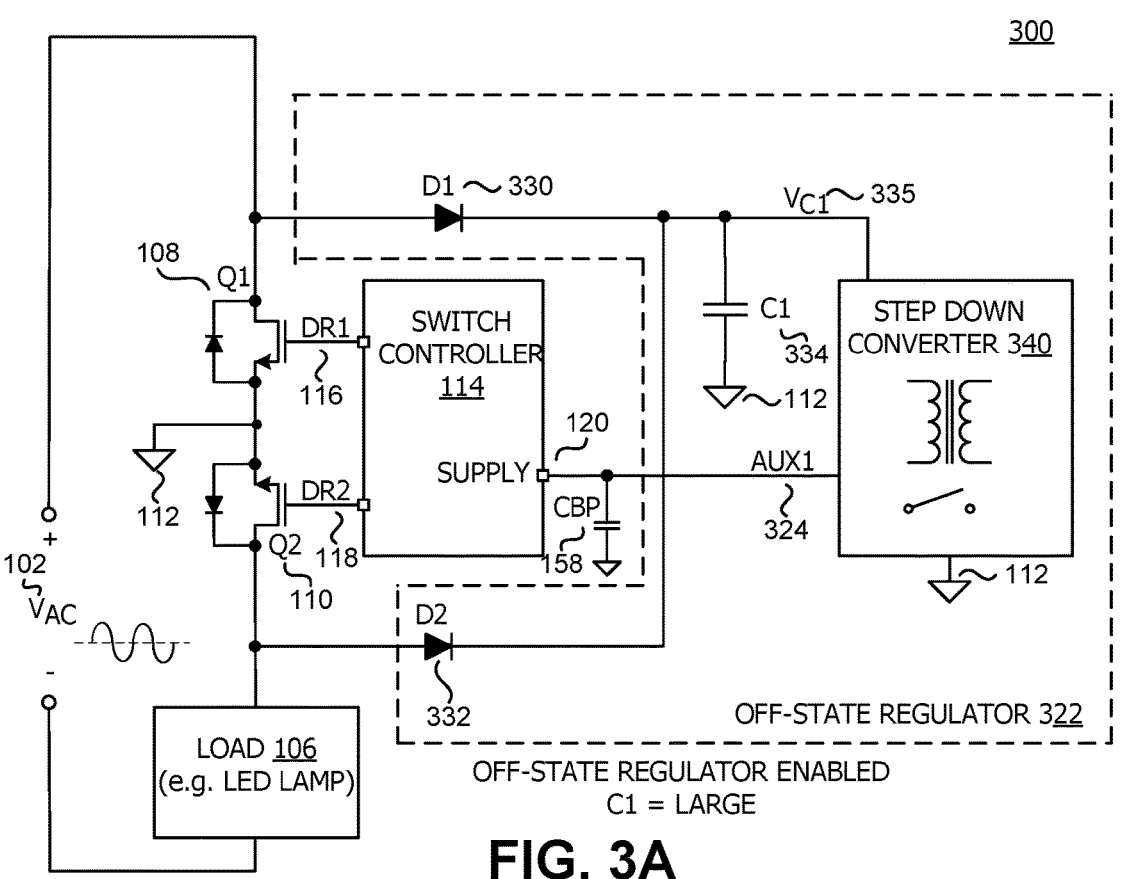
FIG. 3A is another example of the off-state regulator of FIG. 1, in accordance with embodiments of the present disclosure.

FIG. 3A illustrates an off-state regulator 322 which outputs a regulation signal AUX1 324, which is one example of the off-state regulator 122 and regulation signal AUX 1 124 shown with respect to FIG. 1. It should be appreciated that similarly named and numbered elements couple and function as described above. Further, the on-state regulator, request signal and enable signal are not shown for clarity. For the circuit 300 shown, the request signal indicates to decouple the ac input voltage $V_{AC}$ 102 from the load 106 and the enable signal enables the off-state regulator 322 to provide supply regulation and disables the on-state regulator.

Off-state regulator 322 is shown including diodes D1 230, D2 232, capacitance C1 334, and step down converter 340. Diode D1 330 is coupled to the positive terminal of the ac input voltage $V_{AC}$ 102 while diode D2 332 is coupled to load 106. Capacitance C1 334 is coupled to diode D1 330 and diode D2 332 and referenced to return 112. In particular, the capacitance C1 334 is coupled to the cathode of both diodes D1 330, D2 232. The voltage across the capacitance C1 334 is shown as capacitance voltage $V_{C1}$ 335. The anode of diode D1 330 is coupled to the ac input voltage $V_{AC}$ 102 while the anode of diode D1 330 is coupled to the load 106. As such, diode D1 330 and diode D2 332 rectify the ac input voltage $V_{AC}$ 102.

For the embodiment shown in FIG. 3A, the value for capacitance C1 334 is large enough such that a substantially dc voltage is received by step down converter 340. In other words, the value of capacitance C1 334 is large enough such that the capacitance voltage $V_{C1}$ 335 is substantially equal to the peak value of the rectified ac input voltage $V_{AC}$ 102. Because the value of the capacitance is large enough such that a dc voltage is received by step down converter 340, diode D1 330 or diode D2 332 conduct at the extremums of the ac input voltage $V_{AC}$ 102 once the capacitance C1 334 is charged. Diodes D1 330 or D2 332 begin conducting when the magnitude of the ac input voltage $V_{AC}$ 102 reaches or is greater than the capacitance voltage $V_{C1}$ 335 and stops conducting at the extremum of the ac input voltage $V_{AC}$ 102. In particular, diodes D1 330 or D2 332 start conducting just before the extremum of the ac input voltage $V_{AC}$ 102 and stop conducting at the extremum of the ac input voltage $V_{AC}$ 102. In one example, the duration of time before the extremum which diode D1 330 or diode D2 332 start conducting is dependent on the value of capacitance C1 334 and the energy supplied to capacitance CBP 158 and switch controller 114 by the regulation signal AUX1 224. As such, the diode D1 330 and D2 332 are configured to sense the extremum of the ac input voltage $V_{AC}$ 102.

Step down converter 340 is shown as receiving the capacitance voltage $V_{C1}$ 335 at its input and outputs the regulation signal AUX1 324. In embodiments, step down converter may be an isolated or non-isolated switching step down power converter, such as a step down converter in a buck or flyback configuration. However, it should be appreciated that other step down converter topologies could be utilized. Further, the step down converter may be a step down linear power converter.

The step down converter 340 outputs the regulation signal AUX1 324 to provide operational supply to the switch controller 114 from the capacitance voltage $V_{C1}$ 335. In operation, the step down converter 340 "steps down" (e.g. reduces) the received capacitance voltage $V_{C1}$ 335 and outputs the regulation signal AUX1 324 which is used to regulate the voltage ($V_{SUPPLY}$) across capacitance $C_{BP}$ 158.

In one example, the step down converter 340 is constantly active and providing the regulation signal AUX1 324. In another example, the step down converter 340 may be active when the off-state regulator 322 is enabled. When the ac switch 104 is controlled to decouple the ac input from the load 106, the amount of current drawn from the ac input voltage $V_{AC}$ 102 should be controlled; otherwise the load 106 may exhibit an undesirable response to the current it receives. As mentioned above, the average current is lowest at the extremums of the ac input voltage $V_{AC}$ 102. The step down converter 340 draws current from the ac input voltage $V_{AC}$ 102 when either diodes D1 330 or D2 332 conduct. However, the diodes D1 330 and D2 332 conduct at extremums of the ac input voltage $V_{AC}$ 102. As such, the step down converter 340 draws current from the ac input voltage $V_{AC}$ 102 during extremums of the ac input voltage $V_{AC}$ 102 to regulate the supply to switch controller 114.

Figure 3B:
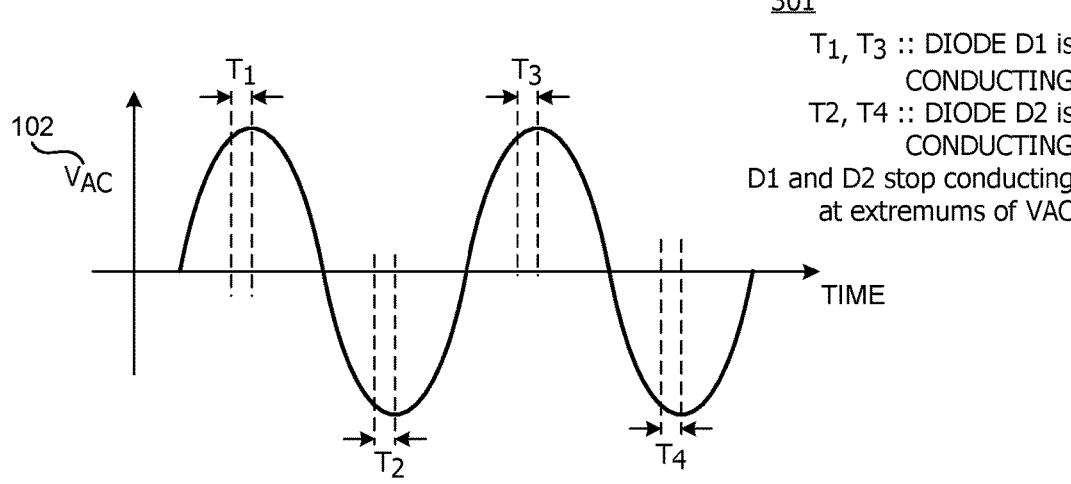
FIG. 3B is a timing diagram for various waveforms of the system and off-state regulator of FIG. 3A, in accordance with embodiments of the present disclosure

FIG. 3B illustrates timing diagram 301 for the ac input voltage $V_{AC}$ 102 for the circuit 300 shown in FIG. 3A. For the embodiment shown in FIG. 3A, the value for capacitance C1 334 is large enough such that a de voltage is received by step down converter 340. In other words, the value of capacitance C1 334 is large enough such that the capacitance voltage $V_{C1}$ 335 is a substantially equal to the peak value of the rectified ac input voltage $V_{AC}$ 102.

The vertical dashed lines shown in FIG. 3B indicate durations T1, T2, T3 and T4. Durations T1, T2, T3 and T4 shown in FIG. 3B are the durations of time which the diodes D1 330 or diode D2 332 are conducting. In other words, durations T1, T2, T3 and T4 represent the durations of time when the step down converter 240 draws current from the ac input voltage $V_{AC}$ 102.

Figure 4A:
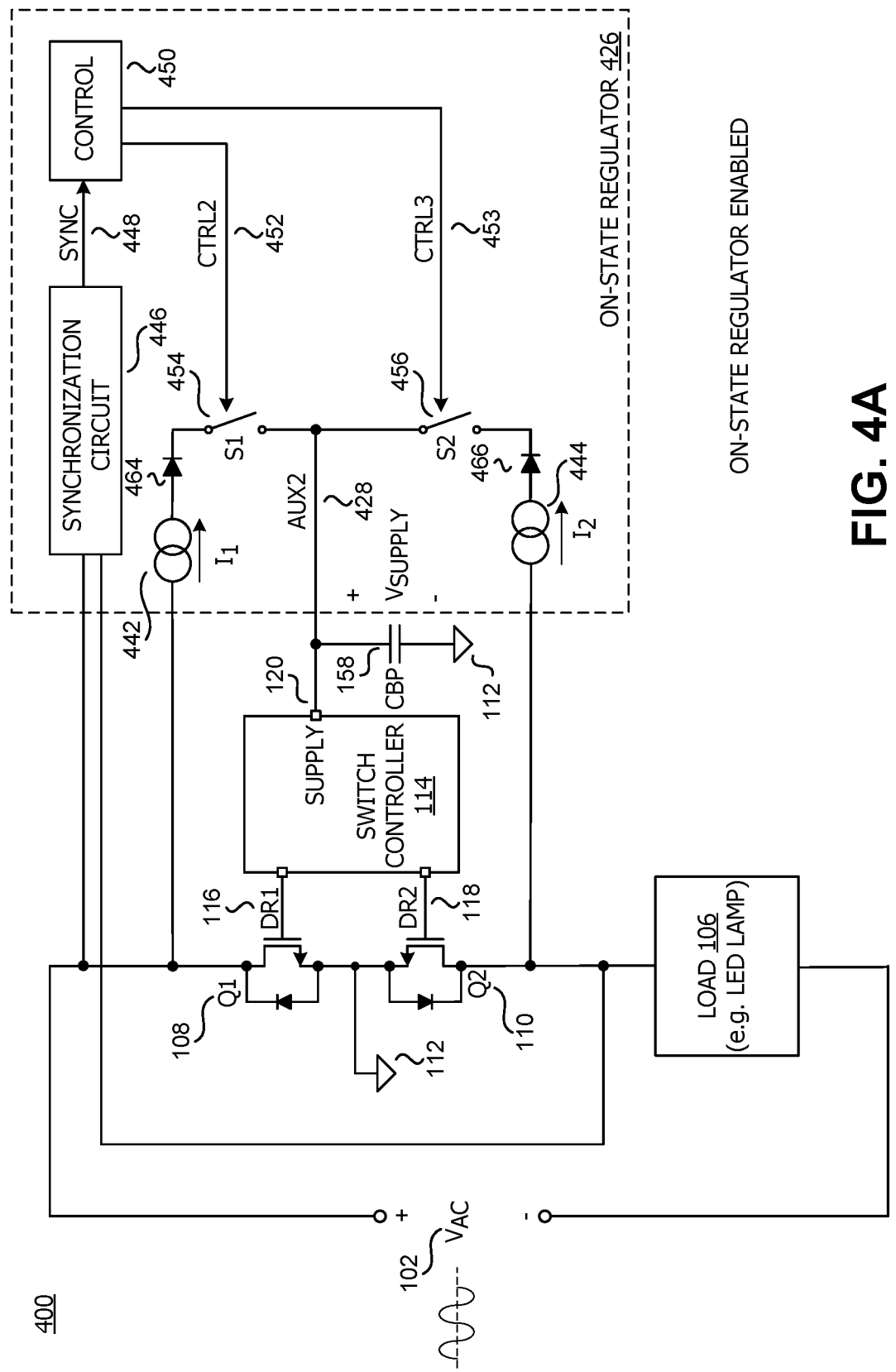
FIG. 4A is one example of an on-state regulator of FIG. 1, in accordance with embodiments of the present disclosure.

FIG. 4A illustrates on-state regulator 426 and regulation signal AUX2 428, which is one example of on-state regulator 126 and regulation signal AUX2 128 shown with respect to FIG. 1. It should be appreciated that similarly named and numbered elements couple and function as described above. Further, the off-state regulator, request signal and enable signal are not shown for clarity. For the circuit 400 shown, the request signal indicates to couple the ac input voltage $V_{AC}$ 102 to the load 106 and the enable signal enables the on-state regulator 426 to provide supply regulation and disables the off-state regulator.

The on-state regulator 426 is configured to provide operational power to the switch controller 114 in response to a request to couple the ac input voltage $V_{AC}$ 102 to the load 106. The on-state regulator 426 is configured to receive the ac input voltage $V_{AC}$ 102 and outputs a regulation signal AUX2 428. The regulation signal AUX2 428 may be a voltage or current signal. The on-state regulator 426 provides supply regulation for the switch controller 114 when the ac switch 104 receives a request to couple the ac input voltage $V_{AC}$ 102 to the load 106. Further, the on-state regulator 426 regulates the voltage ($V_{SUPPLY}$) across the capacitance CBP 158 to provide an operating voltage, operating current, and/or operating power to the switch controller 114. Further, the on-state regulator 426 is configured to regulate the supply for the switch controller 114 substantially near a zero-crossing of the ac input ac input voltage $V_{AC}$ 102. Zero-crossing generally refers to when the ac input voltage $V_{AC}$ 102 crosses zero voltage. In other words, the zero-crossing refers to when the ac input voltage $V_{AC}$ 102 changes sign from positive to negative or from negative to positive.

In one example, the on-state regulator 426 includes current source 442 with current $I_1$, current source 444 with current $I_2$, electrical switch S1 454, electric switch S2 456, synchronization circuit 446, control circuit 450, and diodes 464 and 466. Further shown are the synchronization signal SYNC 448, control signal CTRL2 452, and control signal CTRL3 453. Current source 442 is shown as coupled to the positive terminal of ac input voltage $V_{AC}$ 102 and current source 444 is coupled to the load 106. Electrical switch S1 454 is coupled to current source 442 and electrical switch S2 456. Diode 464 is also shown as coupled to current source 442. Electrical switch S2 456 is further coupled to current source 444. Diode 466 is also shown as coupled to current source 444. As shown, the regulation signal AUX2 428 is provided from a node between electrical switch S1 454 and electrical switch S2 456. It should be appreciated that a junction field-effect transistor (JFET) may be utilized for current sources 442 and 444.

In operation, electrical switches S1 454 and S2 456 are controlled to redirect current from the ac input voltage $V_{AC}$ 102 to regulate the voltage ($V_{SUPPLY}$) across capacitance CBP 158. The amount of current which is redirected is determined by the current sources 442 and 444. For example, if electrical switch S1 454 is turned ON to redirect current from the ac input voltage $V_{AC}$ 102, the amount of current redirected is substantially equal to current $I_1$ of current source 442. Similarly, if electrical switch S2 454 is turned ON to redirect current from the ac input voltage $V_{AC}$ 102, the amount of current redirected is substantially equal to current $I_2$ of current source 444. The redirected current substantially charges capacitance CBP 158 to provide operating power to the switch controller 114.

Synchronization circuit 446 is coupled to the positive terminal of ac input voltage $V_{AC}$ 102 and load 106 for observability. It should be appreciated that the synchronization circuit 446 could be coupled to either the positive terminal of ac input voltage $V_{AC}$ 102 or the load 106. As shown, the synchronization circuit 446 receives the ac input voltage $V_{AC}$ 102 and outputs the synchronization signal SYNC 448. In one embodiment, synchronization circuit 446 senses the zero-crossings of the ac input voltage $V_{AC}$ 102 and utilizes a timer to determine a duration between zero-crossings of the ac input voltage $V_{AC}$ 102. As such, the synchronization circuit 446 senses the zero-crossings and then determines the duration between zero-crossings. The timer is utilized to output the synchronization signal SYNC

448 and further sensing of the zero-crossing is utilized to update the timer. In one example, the outputted synchronization signal SYNC 448 may be representative of timing information corresponding with the zero-crossings of the ac input voltage $V_{AC}$ 102. Or in other words, synchronization signal SYNC 448 may be representative of the durations between zero-crossings of the ac input voltage $V_{AC}$ 102. Synchronization signal SYNC 448 may be utilized to synchronize the turn ON and turn OFF of the electrical switches S1 454, S2 456 with zero-crossings of the ac input voltage $V_{AC}$ 10.

Synchronization signal SYNC 448 may be a voltage or current signal and may be a rectangular pulse waveform of varying durations of "high" and "low" sections with "high" sections. In one example, the duration of logic high sections and logic low sections may correspond with the durations between zero-crossings and leading and trailing edges substantially occur with the zero-crossing of the ac input voltage $V_{AC}$ 102. In one example, the leading and trailing edges substantially occur just prior to a zero-crossing of the ac input voltage $V_{AC}$ 102. Or in other words, the leading and trailing edges of the synchronization signal SYNC 448 may correspond to a time just preceding the zero-crossing of the ac input voltage $V_{AC}$ 102. For example, leading edges may correspond to a time just prior to a negative to positive zero-crossing of the ac input voltage $V_{AC}$ 102 while a trailing edge may correspond to a time just prior to a positive to negative zero-crossing of the ac input voltage $V_{AC}$ 102. As such, the synchronization signal SYNC 448 provides timing information corresponding with zero-crossings of the ac input voltage $V_{AC}$ 102.

Control circuit 450 is coupled to receive the synchronization signal SYNC 448 and outputs control signal CTRL2 452 and control signal CTRL3 453 to control the turn ON and OFF of electrical switch S1 454 and electrical switch S2 456, respectively. As such, the control circuit 450 controls the turn ON and OFF of electrical switch S1 454 and electrical switch S2 456 to correspond with the zero-crossings of the ac input voltage $V_{AC}$ 102. In particular, the control circuit 450 controls the turn ON and OFF of electrical switch S1 454 and electrical switch S2 456 just prior to a zero-crossing of the ac input voltage $V_{AC}$ 102. In one example, control circuit 450 may output control signal CTRL2 452 to turn ON electrical switch S1 454 in response to a leading edge in the synchronization signal SYNC 448 and the control circuit may output the control signal CTRL3 452 to turn ON electrical switch S1 454 in response to a trailing edge in the synchronization signal SYNC 448, or vice versa. As such, the control circuit 450 controls the turn ON of electrical switch S1 454 just prior to a zero-crossing and then turns ON electrical switch S2 456 just prior to the next zero-crossing of the ac input voltage $V_{AC}$ 102. In other words, control circuit 450 alternatingly turns ON electrical switch S1 454 and electrical switch S2 456 corresponding with zero-crossings. In other words, electrical switch S1 454 may turn ON for negative to positive zero-crossings of the ac input voltage $V_{AC}$ 102 while electrical switch 456 may turn ON for positive to negative zero-crossings of the ac input voltage $V_{AC}$ 102.

When either of electrical switch S1 454 or electrical switch S2 456 is controlled ON, electrical switches Q1 108 and Q2 110 are controlled OFF by the switch controller 114. Electrical switch S1 454 or electrical switch S2 456 is turned OFF when the voltage ($V_{SUPPLY}$) across capacitance CBP 158 reaches a regulation value ($V_{REG}$).

When the ac switch is controlled to couple to the ac input voltage $V_{AC}$ 102 to the load, there is usually negligible voltage across the electrical switches Q1 108 and Q2 110 and it may be difficult to provide supply to the switch controller 114. However, by turning off the electrical switches Q1 108 and Q2 110 corresponding to zero-crossings allows the on-state regulator 426 to draw current from the ac input voltage $V_{AC}$ 102 to regulate the voltage ($V_{SUPPLY}$) across capacitance CBP 158. By turning off electrical switches Q1 108 and Q2 110 corresponding to zero-crossings of the ac input voltage $V_{AC}$ 102, the disruption to current delivery to the load 106 may be minimal.

Figure 4B:
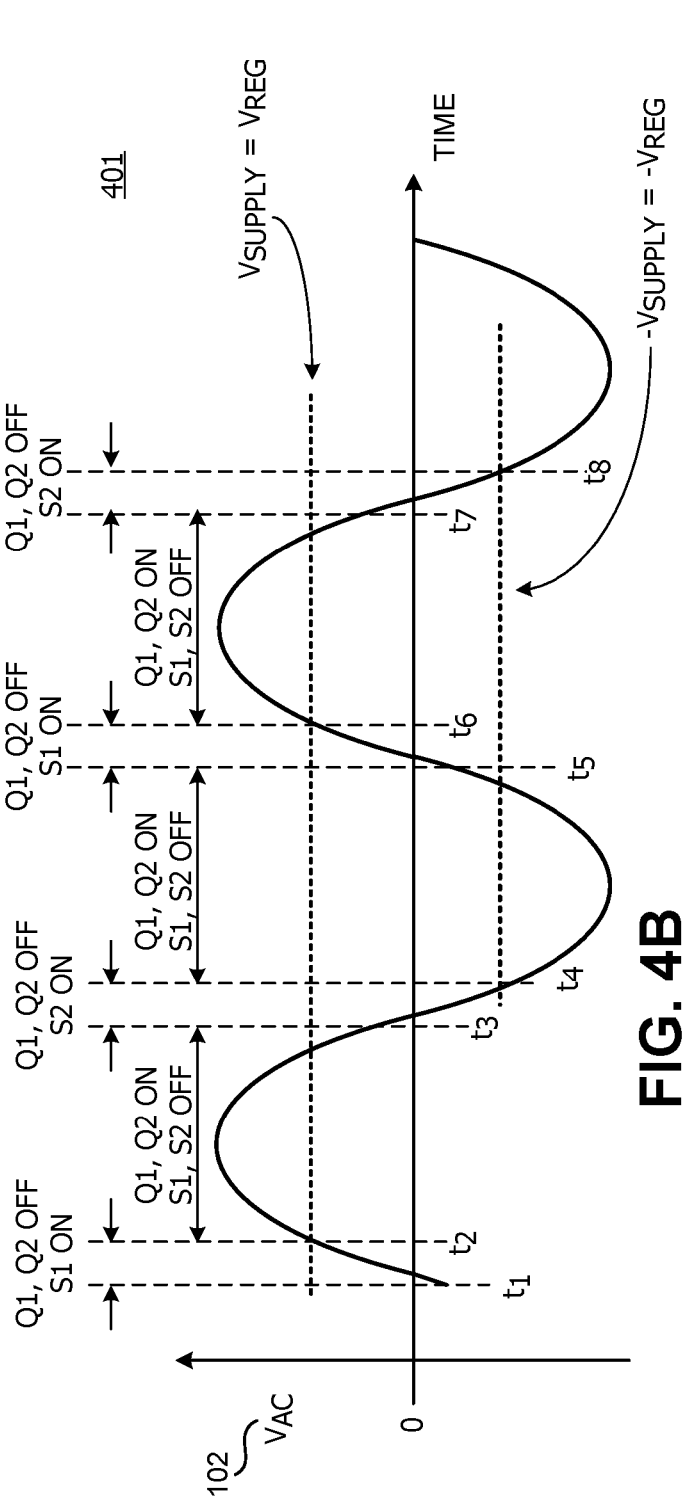
FIG. 4B is a timing diagram for various waveforms of the system and on-state regulator of FIG. 4A, in accordance with embodiments of the present disclosure.

FIG. 4B illustrates a timing diagram of the ac input voltage $V_{AC}$ 102 for the on-state regulator 426 of FIG. 4A. Time $t_1$ occurs right before a negative to positive zero-crossing of the ac input voltage $V_{AC}$ 102. At time $t_1$, electrical switches Q1 108 and Q2 110 are turned OFF, electrical switch S2 456 is turned OFF, and electrical switch S1 454 is turned ON. Between times $t_1$ and $t_2$, electrical switch S1 454 remains ON and current from the ac input voltage $V_{AC}$ 102 is redirected through current source 442 and electrical switch S1 454 to charge capacitance $C_{BP}$ 158. The electrical switch S1 454 remains ON until the voltage $V_{SUPPLY}$ across capacitance $C_{BP}$ 158 reaches a regulation value $V_{REG}$ at time $t_2$. At time $t_2$, electrical switch S1 454 is turned OFF and electrical switches Q1 108 and Q2 110 are turned ON. Between times $t_2$ and $t_3$, electrical switch S1 454 and electrical switch S2 456 remain OFF while electrical switches Q1 108 and Q2 110 remain ON.

Time $t_3$ occurs right before a positive to negative zero-crossing of the ac input voltage $V_{AC}$ 102. At time $t_3$, electrical switches Q1 108 and Q2 110 are turned OFF, electrical switch S1 454 is turned OFF, and electrical switch S2 456 is turned ON. Between times $t_3$ and $t_4$, electrical switch S2 456 remains ON and current from the ac input voltage $V_{AC}$ 102 is redirected through current source 444 and electrical switch S2 456 to charge capacitance $C_{BP}$ 158. The electrical switch S2 456 remains ON until the negative voltage $V_{SUPPLY}$ across capacitance $C_{BP}$ 158 reaches a negative regulation value $V_{REG}$ at time $t_4$. At time $t_4$, electrical switch S2 456 is turned OFF and electrical switches Q1 108 and Q2 110 are turned ON. Between times $t_4$ and $t_5$, electrical switch S1 454 and electrical switch S2 456 remain OFF while electrical switches Q1 108 and Q2 110 remain ON.

Similar to time t1, time $t_5$ occurs right before a negative to positive zero-crossing of the ac input voltage $V_{AC}$ 102. At time $t_5$, electrical switches Q1 108 and Q2 110 are turned OFF, electrical switch S2 456 is turned OFF, and electrical switch S1 454 is turned ON. Between times $t_5$ and $t_6$, electrical switch S1 454 remains ON and current from the ac input voltage $V_{AC}$ 102 is redirected through current source 442 and electrical switch S1 454 to charge capacitance $C_{BP}$ 158. The electrical switch S1 454 remains ON until the voltage $V_{SUPPLY}$ across capacitance $C_{BP}$ 158 reaches a regulation value $V_{REG}$ at time $t_6$. At time $t_6$, electrical switch S1 454 is turned OFF and electrical switches Q1 108 and Q2 110 are turned ON. Between times $t_6$ and $t_7$, electrical switch S1 454 and electrical switch S2 456 remain OFF while electrical switches Q1 108 and Q2 110 remain ON.

Time $t_7$ occurs right before a positive to negative zero-crossing of the ac input voltage $V_{AC}$ 102. At time $t_7$, electrical switches Q1 108 and Q2 110 are turned OFF, electrical switch S1 454 is turned OFF, and electrical switch S2 456 is turned ON. Between times $t_7$ and $t_8$, electrical switch S2 456 remains ON and current from the ac input voltage $V_{AC}$ 102 is redirected through current source 444 and electrical switch S2 456 to charge capacitance $C_{BP}$ 158. The electrical switch S2 456 remains ON until the negative voltage $V_{SUPPLY}$ across capacitance $C_{BP}$ 158 reaches a negative regulation value $V_{REG}$ at time $t_8$. At time $t_8$, electrical switch S2 456 is turned OFF and electrical switches Q1 108 and Q2 110 are turned ON.

As shown electrical switch S1 454 is turned ON for negative to positive zero-crossings of the ac input voltage $V_{AC}$ 102 while electrical switch S2 456 is turned ON for positive to negative zero-crossings of the ac input voltage $V_{AC}$ 102.

Figure 4C:
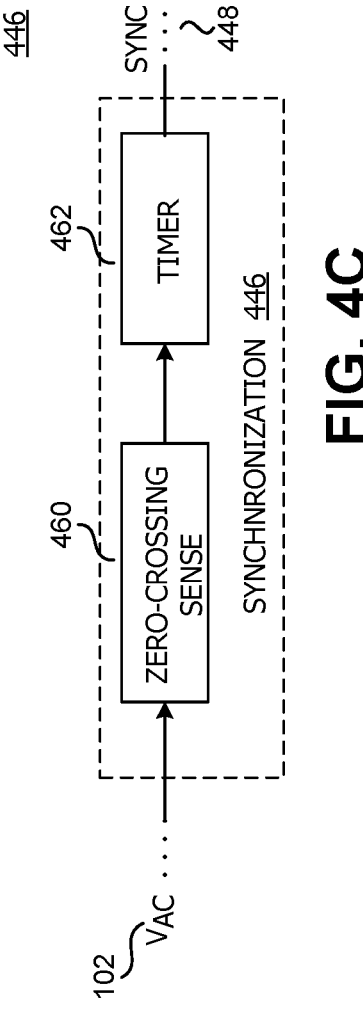
FIG. 4C is one example of a synchronization circuit of FIG. 4A, in accordance with embodiments of the present disclosure.

FIG. 4C illustrates one example synchronization circuit 446. As shown, the synchronization circuit includes a zero-crossing sense circuit 460 and timer 462. The zero-crossing sense circuit 460 receives the ac input voltage $V_{AC}$ 102 and senses when ac input voltage $V_{AC}$ 102 crosses zero. In one example, the zero-crossing sense circuit 460 may be a comparator which compares the zero-crossing sense circuit 460 with a threshold representative of a zero-crossing. The sensed zero crossings are received by timer 462. Timer 462 determines the duration between the sensed zero-crossings and outputs the synchronization signal 448. The timer is utilized to output the synchronization signal SYNC 448 and further sensing of the zero-crossing is utilized to update the duration of the timer.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples1.

A ac switch configured to couple and decouple an ac input to a load, the ac switch comprising a first transistor; a second transistor coupled to the first transistor; a switch controller configured to control the turn ON and turn OFF of the first transistor and the second transistor in response to a request signal, wherein the request signal is representative of a request for the ac switch to couple or decouple the ac input to the load; an off-state regulator coupled to provide supply regulation to the switch controller in response to the request signal indicating to decouple the ac input to the load, wherein the off-state regulator is configured to provide supply regulation for the switch controller at an extremum of the ac input; and an on-state regulator coupled to provide supply regulation to the switch controller in response to the request signal indicating to couple the ac input to the load, wherein the on-state regulator is configured to provide supply regulation for the switch controller at a zero-crossing of the ac input.

Example 2. The ac switch of example 1, wherein the off-state regulator provides operational power during the extremum of the ac input.

Example 3. The ac switch of any one of examples 1 or 2, the off-state regulator further comprising a first diode configured to receive and rectify the ac input; a second diode coupled to the first diode and configured to rectify the ac input; a capacitance coupled to the first diode and the second diode, wherein a capacitance voltage is responsive to the ac input; and a step down converter coupled to the capacitance and configured to receive the capacitance voltage, the step down converter is further configured to provide a regulation signal from the capacitance voltage, wherein the regulation signal is less than the capacitance voltage.

Example 4. The ac switch of any one of examples 1 to 3, wherein a value of the capacitance is large enough such that the capacitance voltage is substantially equal to a peak of the ac input.

Example 5. The ac switch of any one of examples 1 to 4, the off-state regulator further comprising: an extremum sense coupled to receive the ac input and configured to sense the extremum of the ac input, wherein the extremum sense outputs an extremum signal representative of the extremum of the ac input; a converter control coupled to receive the extremum signal and configured to output a control signal to activate the step down converter, wherein the step down converter is activated during the extremum of the ac input.

Example 6. The ac switch of any one of examples 1 to 5, wherein a value of the capacitance is small enough such that the capacitance voltage substantially follows a rectified ac input.

Example 7. The ac switch of any one of examples 1 to 6, wherein the on-state regulator provides operational power during the zero-crossing of the ac input.

Example 8. The ac switch of any one of examples 1 to 7, the on-state regulator comprising a first switch configured to receive at a first portion of current from the ac input; a second switch configured to receive a second portion of current from the ac input; and a control circuit configured to control the turn ON and turn OFF of the first switch and the second switch, wherein the first switch is turned ON during a negative to positive zero-crossing of the ac input and the second switch is turned ON during a positive to negative zero-crossing of the ac input.

Example 9. The ac switch of any one of examples 1 to 8, wherein the first transistor and the second transistor are turned OFF during the negative to positive zero-crossing of the ac input and the positive to negative zero-crossing of the ac input.

Example 10. The ac switch of any one of examples 1 to 9, the on-state regulator further comprising: a synchronization circuit configured to receive the ac input and coupled to provide a synchronization signal representative of timing between zero-crossings of the ac input, wherein the control circuit is configured to control the turn ON and turn OFF of the first switch and the second switch in response to the synchronization signal.

Example 11. The ac switch of any one of examples 1 to 10, wherein the first switch is coupled to a first current source, wherein the first current source determines the first portion of current from the ac input; and the second switch is coupled to a second current source, wherein the second current source determines the second a second portion of current from the ac input.

Example 12. A method for providing supply regulation for an ac switch configured to couple and decouple an ac input to a load, the method comprising receiving a request to couple or decouple the ac input to the load; in response to the request to decouple the ac input from the load, enabling an off-state regulator, wherein enabling the off-state regulator further comprises activating a step down converter during an extremum of an ac input; and in response to the request to couple the ac input to the load, enabling an on-state regulator, wherein enabling the on-state regulator further comprises controlling a turn ON of a switch during a zero-crossing of an ac input.

Example 13. The method of example 12, wherein activating the step down converter during an extremum of an ac input further comprises rectifying the ac input; and providing supply from the rectified ac input.

Example 14. The method of example 12 or 13, wherein activating the step down converter during an extremum of an ac input further comprises sensing the extremum of the ac input.

Example 15. The method of any one of examples 12 to 14, wherein controlling the turn ON of a switch during the zero-crossing of an ac input, further comprises: sensing the zero-crossing of the ac input; timing the duration between the zero-crossing and a next zero-crossing of the ac input; outputting a control signal to turn ON the switch in response to timing the duration between the zero-crossing and a next zero-crossing.

Example 16. An ac switch configured to couple and decouple an ac input voltage to a load, the ac switch comprising a first transistor; a second transistor coupled to the first transistor; a switch controller configured to control the turn ON and turn OFF of the first transistor and the second transistor in response to a request signal, wherein the request signal is representative of a request for the ac switch to couple or decouple the ac input voltage to the load; an off-state regulator coupled to provide supply regulation to the switch controller in response to the request signal indicating to decouple the ac input voltage to the load, wherein the off-state regulator is configured to regulate a supply voltage for the switch controller during an extremum of the ac input voltage; and an on-state regulator coupled to provide supply regulation to the switch controller in response to the request signal indicating to couple the ac input to the load, wherein the on-state regulator is configured to regulate the supply voltage for the switch controller during a zero-crossing of the ac input voltage.

Example 17. The ac switch of example 16, the off-state regulator further comprising a first diode configured to receive and rectify the ac input voltage; a second diode coupled to the first diode and configured to rectify the ac input voltage; a capacitance coupled to the first diode and the second diode, wherein a capacitance voltage is responsive to the ac input voltage; and a step down converter coupled to the capacitance and configured to receive the capacitance voltage, the step down converter is further configured to regulate the supply voltage from the capacitance voltage, wherein the supply voltage is less than the capacitance voltage.

Example 18. The ac switch of example 16 or 17, wherein a value of the capacitance is large enough such that the capacitance voltage is substantially equal to a peak of the ac input voltage.

Example 19. The ac switch of any one of examples 16 to 18, the off-state regulator further comprising an extremum sense configured to receive the ac input voltage and sense the extremum of the ac input voltage and output an extremum signal representative of the extremum; and a converter control coupled to receive the extremum signal and configured to output a control signal to activate the step down converter, wherein the step down converter is activated during the extremum of the ac input.

Example 20. The ac switch of any one of examples 16 to 19, wherein a value of the capacitance is small enough such that the capacitance voltage substantially follows a rectified ac input.

Example 21. The ac switch of any one of examples 16 to 20, the on-state regulator comprising a first switch configured to receive a first portion of current from the ac input voltage; a second switch configured to receive a second portion of current from the ac input voltage; and a control circuit configured to control the turn ON and turn OFF of the first switch and the second switch, wherein the first switch is turned ON during a negative to positive zero-crossing of the ac input voltage and the second switch is turned ON during a positive to negative zero-crossing of the ac input voltage.

Example 22. The ac switch of any one of examples 16 to 21, wherein the first transistor and the second transistor are turned OFF during the negative to positive zero-crossing of the ac input voltage and the positive to negative zero-crossing of the ac input voltage.

Example 23. The ac switch of any one of examples 16 to 22, the on-state regulator further comprising a synchronization circuit configured to receive the ac input voltage and provide a synchronization signal representative of timing between zero-crossings of the ac input voltage, wherein the control circuit is configured to control the turn ON and turn OFF of the first switch and the second switch in response to the synchronization signal.

Example 24. The ac switch of any one of examples 16 to 23, wherein the first switch is coupled to a first current source, wherein the first current source determines the first portion of current from the ac input voltage; and the second switch is coupled to a second current source, wherein the second current source determines the second a second portion of current from the ac input voltage.

What is claimed is:

1. An ac switch configured to couple and decouple an ac input to a load, the ac switch comprising:
   a first transistor;
   a second transistor coupled to the first transistor;
   a switch controller configured to control the turn ON and turn OFF the first transistor and the second transistor in response to a request signal, wherein the request signal is representative of a request for the ac switch to couple or decouple the ac input to the load;
   an off-state regulator coupled to provide a supply regulation to the switch controller in response to the request signal indicating to decouple the ac input to the load, wherein the off-state regulator is configured to provide the supply regulation for the switch controller at an extremum of the ac input; and
   an on-state regulator coupled to provide the supply regulation to the switch controller in response to the request signal indicating to couple the ac input to the load, wherein the on-state regulator is configured to provide the supply regulation for the switch controller at a zero-crossing of the ac input.

2. The ac switch of claim 1, wherein the off-state regulator provides operational power for the switch controller during the extremum of the ac input.

3. The ac switch of claim 1, the off-state regulator further comprising:
   a first diode configured to receive and rectify the ac input;
   a second diode coupled to the first diode and configured to rectify the ac input; a capacitance element coupled to the first diode and the second diode, wherein a capacitance voltage of the capacitance element is responsive to the ac input; and
   a step down converter coupled to the capacitance element and configured to receive the capacitance voltage, the step down converter is further configured to provide a regulation signal from the capacitance voltage, wherein the regulation signal is less than the capacitance voltage.

4. The ac switch of claim 3, wherein a value of the capacitance element is large enough such that the capacitance voltage is substantially equal to a peak of the ac input.

5. The ac switch of claim 3, the off-state regulator further comprising:

an extremum sense coupled to receive the ac input and configured to sense the extremum of the ac input, wherein the extremum sense outputs an extremum signal representative of the extremum of the ac input;

a converter control coupled to receive the extremum signal and configured to output a control signal to activate the step down converter, wherein the step down converter is activated during the extremum of the ac input.

6. The ac switch of claim 5, wherein a value of the capacitance element is small enough such that the capacitance voltage substantially follows a rectified ac input voltage Vac of the ac input.

7. The ac switch of claim 1, wherein the on-state regulator provides operational power for the switch controller during the zero-crossing of the ac input.

8. The ac switch of claim 1, the on-state regulator comprising:

a first switch configured to receive a first portion of current from the ac input;

a second switch configured to receive a second portion of current from the ac input; and a control circuit configured to control the turn ON and turn OFF of the first switch and the second switch, wherein the first switch is turned ON during a negative to positive zero-crossing of the ac input and the second switch is turned ON during a positive to negative zero-crossing of the ac input.

9. The ac switch of claim 8, wherein the first transistor and the second transistor are turned OFF during the negative to positive zero-crossing of the ac input and the positive to negative zero-crossing of the ac input.

10. The ac switch of claim 8, the on-state regulator further comprising:

a synchronization circuit configured to receive the ac input and coupled to provide a synchronization signal representative of timing between zero-crossings of the ac input, wherein the control circuit is configured to control the turn ON and turn OFF of the first switch and the second switch in response to the synchronization signal.

11. The ac switch of claim 8, wherein the first switch is coupled to a first current source, wherein the first current source determines the first portion of current from the ac input; and the second switch is coupled to a second current source, wherein the second current source determines the second a second portion of current from the ac input.

12. A method for providing a supply regulation for an ac switch configured to couple and decouple an ac input to a load, the method comprising:

receiving a request to couple or decouple the ac input to the load;

in response to the request to decouple the ac input from the load, enabling an off-state regulator, wherein enabling the off-state regulator further comprises activating a step down converter during an extremum of the ac input; and in response to the request to couple the ac input to the load, enabling an on state regulator, wherein enabling the on-state regulator further comprises controlling, via a control circuit of the on state regulator, a turn ON of either of a first switch and a second switch during a zero-crossing of the ac input.

13. The method of claim 12, wherein activating the step down converter during the extremum of the ac input further comprises:

rectifying the ac input; and providing the supply regulation from the rectified ac input.

14. The method of claim 13, wherein activating the step down converter during the extremum of the ac input further comprises sensing the extremum of the ac input.

15. The method of claim 12, wherein controlling the turn ON of the first switch and the second switch during the zero-crossing of the ac input, further comprises:

sensing the zero-crossing of the ac input;

timing the duration between the zero-crossing and a next zero-crossing of the ac input;

outputting a control signal to turn ON the first switch and the second switch in response to timing the duration between the zero-crossing and a next zero-crossing of the ac input.

16. An ac switch configured to couple and decouple an ac input voltage to a load, the ac switch comprising:

a first transistor;

a second transistor coupled to the first transistor;

a switch controller configured to control the turn ON and turn OFF of the first transistor and the second transistor in response to a request signal, wherein the request signal is representative of a request for the ac switch to couple or decouple the ac input voltage to the load;

an off-state regulator configured to regulate the switch controller in response to the request signal indicating to decouple the ac input voltage to the load, wherein the off-state regulator is configured to regulate a supply voltage for the switch controller during an extremum of the ac input voltage; and an on-state regulator configured to regulate the switch controller in response to the request signal indicating to couple the ac input to the load, wherein the on-state regulator is configured to regulate the supply voltage for the switch controller during a zero-crossing of the ac input voltage.

17. The ac switch of claim 16, the off-state regulator further comprising:

a first diode configured to receive and rectify the ac input voltage;

a second diode coupled to the first diode and configured to rectify the ac input voltage;

a capacitance element coupled to the first diode and the second diode, wherein a capacitance voltage of the capacitance element is responsive to the ac input voltage; and a step down converter coupled to the capacitance element and configured to receive the capacitance voltage, the step down converter is further configured to regulate the supply voltage from the capacitance voltage, wherein the supply voltage is less than the capacitance voltage.

18. The ac switch of claim 16, wherein a value of the capacitance element is large enough such that the capacitance voltage is substantially equal to a peak of the ac input voltage.

19. The ac switch of claim 16, the off-state regulator further comprising: an extremum sense configured to receive the ac input voltage and sense the extremum of the ac input voltage and output an extremum signal representative of the extremum; and a converter control coupled to receive the extremum signal and configured to output a control signal to activate the step down converter, wherein the step down converter is activated during the extremum of the ac input.

20. The ac switch of claim 19, wherein a value of the capacitance element is small enough such that the capacitance voltage substantially follows a rectified ac input voltage Vac of the ac input.

21. The ac switch of claim 16, the on-state regulator comprising:

a first switch configured to receive a first portion of current from the ac input voltage;

a second switch configured to receive a second portion of current from the ac input voltage; and a control circuit configured to control the turn ON and turn OFF of the first switch and the second switch, wherein the first switch is turned ON during a negative to positive zero-crossing of the ac input voltage and the second switch is turned ON during a positive to negative zero-crossing of the ac input voltage.

22. The ac switch of claim 21, wherein the first transistor and the second transistor are turned OFF during the negative to positive zero-crossing of the ac input voltage and the positive to negative zero-crossing of the ac input voltage.

23. The ac switch of claim 21, the on-state regulator further comprising:

a synchronization circuit configured to receive the ac input voltage and provide a synchronization signal representative of timing between zero-crossings of the ac input voltage, wherein the control circuit is configured to control the turn ON and turn OFF of the first switch and the second switch in response to the synchronization signal.

24. The ac switch of claim 21, wherein the first switch is coupled to a first current source, wherein the first current source determines the first portion of current from the ac input voltage; and the second switch is coupled to a second current source, wherein the second current source determines the second a second portion of current from the ac input voltage.

* * * * *